(12) United States Patent
Ka (10) Patent No.: US 9,374,095 B2
(45) Date of Patent: Jun. 21, 2016

(54) COUNTER CIRCUIT AND SEMICONDUCTOR DEVICE INCLUDING THE SAME

(71) Applicant: SK hynix Inc., Gyeonggi-do (KR)

(72) Inventor: Dong-Yoon Ka, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 211 days.

(21) Appl. No.: 14/106,830

(22) Filed: Dec. 15, 2013

(65) Prior Publication Data

US 2015/0098294 A1    Apr. 9, 2015

(30) Foreign Application Priority Data

Oct. 8, 2013   (KR) ................ 10-2013-0119852

(51) Int. Cl.
| | | |
|---|---|---|
| G11C 8/00 | (2006.01) |
| H03K 21/00 | (2006.01) |
| G11C 29/18 | (2006.01) |
| H03K 21/02 | (2006.01) |

(52) U.S. Cl.
CPC ............... *H03K 21/00* (2013.01); *G11C 29/18* (2013.01); *H03K 21/023* (2013.01)

(58) Field of Classification Search
USPC ...................................... 365/230.06
See application file for complete search history.

(56) References Cited

U.S. PATENT DOCUMENTS

| | | | | |
|---|---|---|---|---|
| 3,255,438 A * | 6/1966 | Leonard | ............... | G06F 13/4022 711/4 |
| 4,348,743 A * | 9/1982 | Dozier | ............... | G06F 9/4825 368/107 |
| 5,355,136 A * | 10/1994 | Katagiri | ............ | H02M 7/53873 341/157 |
| 5,526,393 A * | 6/1996 | Kondo | ............... | H03K 23/50 377/106 |
| 5,991,308 A * | 11/1999 | Fuhrmann | ........... | H03M 13/256 348/E7.07 |
| 6,038,166 A * | 3/2000 | Wong | ............... | G11C 11/5621 365/185.03 |
| 6,294,905 B1 * | 9/2001 | Schwartz | ............... | H03K 17/64 323/288 |
| 7,812,673 B1 * | 10/2010 | Gilbert | ............... | H03F 1/0277 330/279 |
| 8,179,296 B2 * | 5/2012 | Kelly | ............... | H03M 1/145 341/155 |
| 2002/0089887 A1 * | 7/2002 | Hii | ............... | G01R 31/30 365/201 |
| 2003/0231736 A1 * | 12/2003 | Yamamura | ............ | H03K 23/50 377/118 |
| 2003/0234673 A1 * | 12/2003 | Kirsch | ............... | H03L 7/0814 327/277 |
| 2004/0257137 A1 * | 12/2004 | Chang | ............... | H03K 5/13 327/233 |
| 2010/0225796 A1 * | 9/2010 | Lim | ............... | H03M 1/0607 348/308 |
| 2011/0205100 A1 * | 8/2011 | Bogaerts | ............ | H04N 5/3575 341/169 |
| 2015/0028190 A1 * | 1/2015 | Shin | ............... | H03K 21/38 250/208.1 |

FOREIGN PATENT DOCUMENTS

KR    1020000055740    9/2000

* cited by examiner

*Primary Examiner* — Hoai V Ho
*Assistant Examiner* — Pablo Huerta
(74) *Attorney, Agent, or Firm* — IP & T Group LLP (57) ABSTRACT

A counter circuit includes a lower count signal generation unit suitable for generating a lower bit, an upper count signal generation unit suitable for generating an upper bit, and a control unit suitable for determining a counting route in response to a control signal and controlling the lower and upper count signal generation units based on a determined route, wherein in a first route, the upper bit is generated in response to the lower bit, and in a second route, the lower bit is generated in response to the upper bit.

20 Claims, 5 Drawing Sheets

COUNTER CIRCUIT AND SEMICONDUCTOR DEVICE INCLUDING THE SAME

CROSS-REFERENCE TO RELATED APPLICATIONS

The present application claims priority of Korean Patent Application No. 10-2013-0119852, filed on Oct. 8, 2013, which is incorporated herein by reference in its entirety.

BACKGROUND

1. Field

Exemplary embodiments of the present invention relate to a semiconductor design technology, and more particularly, to a counter circuit and a semiconductor device including the same.

2. Description of the Related Art

A typical counter circuit sequentially increases bits from a lower bit to an upper bit, so that a specific address or a decoding signal targeted by a user may be searched and selected. Particularly, in the case of an address counter included in a semiconductor chip in the form of an array, it may be difficult to select only an address group belonging to a specific category, resulting in an increase in a test time and an operation time for applying the address counter.

SUMMARY

Exemplary embodiments of the present invention are directed to a semiconductor device having an address counter circuit capable of selecting a specific address group and quickly searching a target address in the group.

Exemplary embodiments of the present invention are directed to a counter circuit capable of quickly searching a target value by minimizing the number of times a strobe signal is applied.

In accordance with an exemplary embodiment of the present invention, a counter circuit includes a lower count signal generation unit suitable for generating a lower bit, an upper count signal generation unit suitable for generating an upper bit, and a control unit suitable for determining a counting route in response to a control signal and controlling the lower and upper count signal generation units based on a determined route, wherein in a first route, the upper bit is generated in response to the lower bit, and in a second route, the lower bit is generated in response to the upper bit.

In accordance with another exemplary embodiment of the present invention, a counter circuit includes a plurality of count signal generation units suitable for generating a plurality of bits of an output signal by counting a strobe signal, and a control unit suitable for inputting the strobe signal to a first count signal generation unit generating a least significant bit of the output signal or a last count signal generation unit generating a most significant bit of the output signal in response to a control signal, wherein the control unit transmits the strobe signal through the count signal generation units in a first order of the first to last count signal generation units when the strobe signal is inputted to the first count signal generation unit, and the control unit transmits the strobe signal through the count signal generation units in a second order of the last to first count signal generation units when the strobe signal is inputted to the last count signal generation unit.

In accordance with further exemplary embodiment of the present invention, a semiconductor device includes a cell array including a plurality of groups of memory cells, each group of memory cells connected to a majority of word lines, an address counter suitable for generating a word line address signal for selecting the word lines and a mat address signal for selecting the groups of memory cells in response to a strobe signal, and a row decoder suitable for activating the word lines in response to the word line and mat address signals, wherein the address counter performs an counting operation in a first order from the word line address signal to the mat address signal in response to a first logic level of a control signal, and performs the counting operation in a second order from the mat address signal to the word line address signal in response to a second logic level of the control signal.

According to the aforementioned embodiments, a counter circuit for controlling an application direction of a strobe signal is provided, so that a target value may be quickly searched by minimizing the number of times the strobe signal is applied.

Furthermore, a specific group may be preferentially selected from a cell array including a plurality of groups of cells to quickly search a target address.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
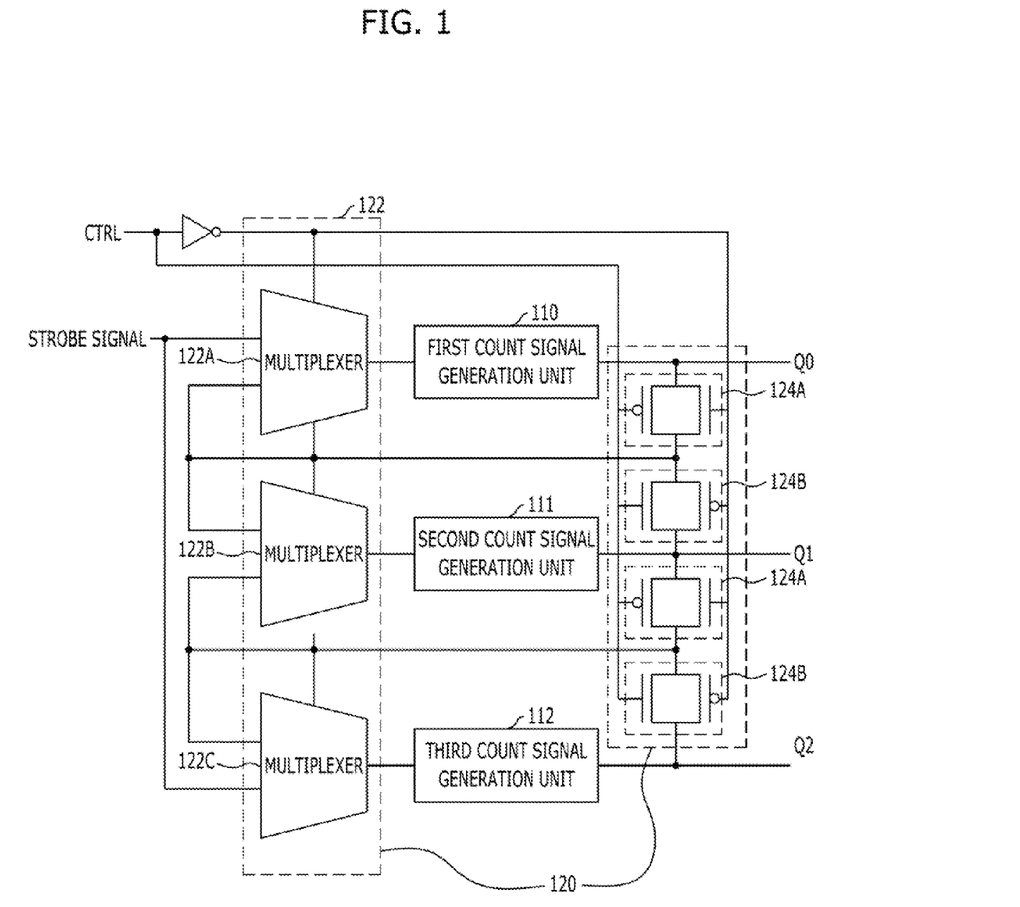
FIG. 1 is a circuit diagram illustrating a counter circuit in accordance with an exemplary embodiment of the present invention.

FIG. 1 is a circuit diagram illustrating a counter circuit in accordance with an exemplary embodiment of the present invention.

Referring to FIG. 1, the counter circuit may include a first count signal generation unit 110, a second count signal generation unit 111, a third count signal generation unit 112, and a control unit 120. Hereinafter, only the configurations of the first to third count signal generation units 110 to 112 will be described as an example. However, the counter circuit may include a plurality of count signal generation units having substantially the same configuration.

The first to third count signal generation units 110 to 112 may be a plurality of flip-flops serially coupled to one another.

The first count signal generation unit 110 may generate a least significant bit Q0. The second count signal generation unit 111 may generate an intermediate significant bit Q1. The third count signal generation unit 112 may generate a most significant bit Q2.

The control unit 120 may be configured such that the first to third count signal generation units 110 to 112 are coupled in a forward route or a backward route in response to a control signal CTRL. When the first to third count signal generation units 110 to 112 are coupled in the forward route, the first to third count signal generation units 110 to 112 may perform counting in a forward direction. When the first to third count signal generation units 110 to 112 are coupled in the backward route, the first to third count signal generation units 110 to 112 may perform counting in a backward direction.

To this end, the control unit 120 may include a forward feedback control section 124A, a backward feedback control section 124B, and an input control section 122.

The forward feedback control section 124A may transmit the output of the first to third count signal generation units 110 to 112 in the forward route. The backward feedback control section 124B may transmit the output of the first to third count signal generation units 110 to 112 in the backward route.

To this end, the forward feedback control section 124A and the backward feedback control section 124B may include path gates.

The path gate constituting the forward feedback control section 124A and the backward feedback control section 124B may be configured as a PMOS transistor and/or a NMOS transistor. The forward feedback control section 124A and the backward feedback control section 124B configured as above may constitute a forward counter route or a backward counter route in response to the control signal CTRL.

The input control section 122 may include first to third multiplexers 122A to 122C that output a strobe signal to the first count signal generation unit 110 in the forward route, and output the strobe signal to the third count signal generation unit 112 in the backward route.

In detail, the first to third multiplexers 122A to 122C may be configured to correspond to the first to third count signal generation units 110 to 112, respectively. The first to third multiplexers 122A to 122C may transmit the output of one of the first to third count signal generation units 110 to 112 to another of the first to third count signal generation units 110 to 112, which generate subsequent bits, in response to the control signal CTRL. For example, when the control signal CTRL is a forward signal, the output of the forward feedback control section 124A is inputted to a count signal generation unit generating a more significant bit. When the control signal CTRL is a backward signal, the output of the backward feedback control section 124B is inputted to a count signal generation unit generating a less significant bit. At this time, the output may be prevented from being inputted to an opposite route.

Hereinafter, an operation according to one embodiment of the present invention will be described. In order to facilitate the understanding, the concept of the embodiment of the present invention will be first described.

Figure 2:
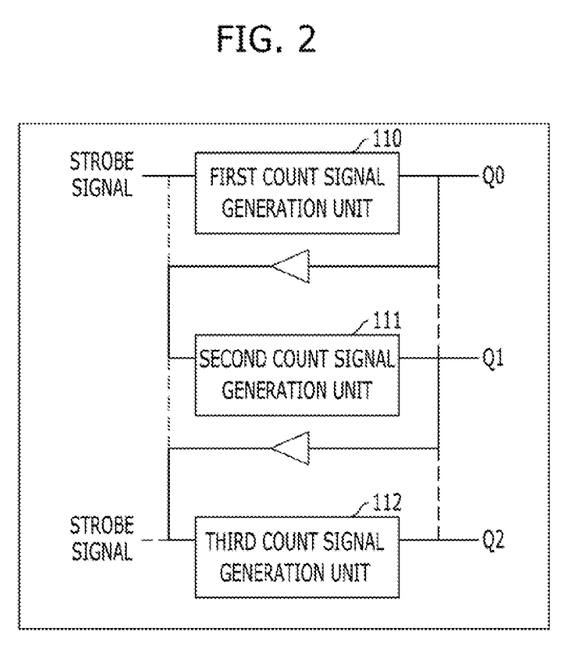
FIGS. 2 and 3 are diagrams illustrating a counter control method in accordance with an exemplary embodiment of the present invention.
Figure 3:
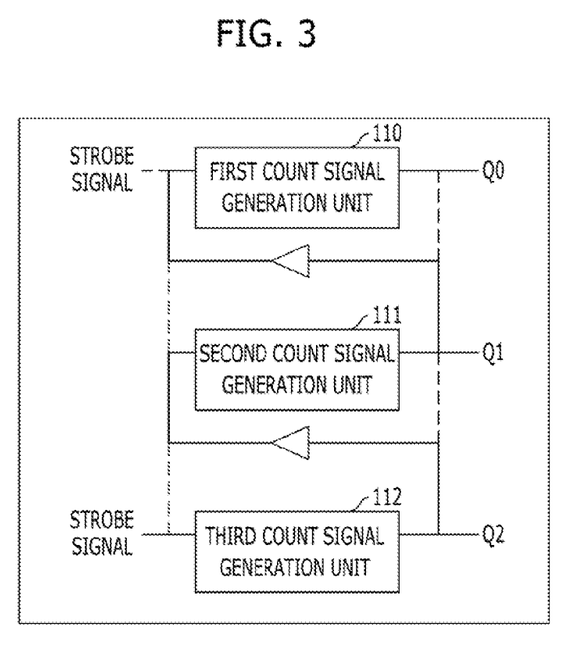

FIGS. 2 and 3 are diagrams illustrating a counter control method in accordance with an exemplary embodiment of the present invention.

FIG. 2 is a conceptual diagram illustrating the case in which counting is performed in a forward direction. The first to third count signal generation units 110 to 112 sequentially perform counting from the least significant bit Q0 by the strobe signal inputted in the forward direction. In detail, the first count signal generation unit 110 may receive the strobe signal and generate the least significant bit Q0. Then, the second count signal generation unit 111 may receive the output signal Q0 of the first count signal generation unit 110, and generate the intermediate significant bit Q1. Then, the third count signal generation unit 112 may receive the output signal Q1 of the second count signal generation unit 111, and generate the most significant bit Q2.

According to the aforementioned operation, the output values 'Q0', 'Q1', and 'Q2' (the least significant bit, the intermediate significant bit, and the most significant bit) of the counter may increase in the order as (1,0,0), (0,1,0), (1,1,0), and (0,0,1) are arranged.

FIG. 3 is a conceptual diagram illustrating the case in which counting is performed in a backward direction. In FIG. 3, the strobe signal may be inputted in the backward direction. That is, the strobe signal may be inputted to the third count signal generation unit 112. At this time, the counting may be sequentially performed from the most significant bit Q2, and the output values Q0, Q1, and Q2 of the first to third count signal generation units 110 to 112 may be (0,0,1), (0,1,0), (0,1,1), and (1,0,0).

As described above, the embodiment of the present invention includes the concept of the forward or backward counting. Furthermore, in the embodiment of the present invention, a target count signal may be quickly generated using the control signal. The operation of the embodiment of the present invention will be described in detail below.

Hereinafter, the operation according to one embodiment of the present invention will be described with reference to the timing diagram of FIG. 4.

Figure 4:
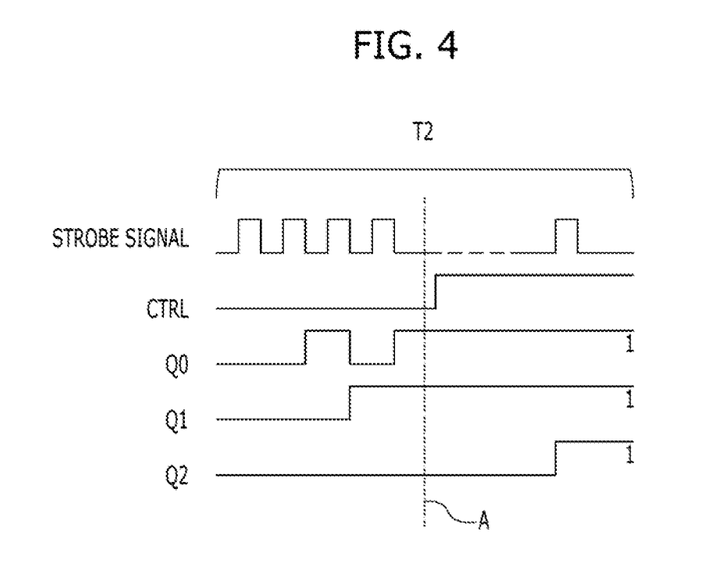
FIG. 4 is a timing diagram illustrating an operation for generating a counter output value '111' in accordance with an exemplary embodiment of the present invention.

FIG. 4 is a timing diagram illustrating an operation for generating a counter output value '111' in accordance with an exemplary embodiment of the present invention.

The counter circuit may be controlled by the control signal CTRL and receive the strobe signal. At this time, the control signal CTRL may be a forward signal that ensures the forward route and a backward signal that ensures the backward route. For example, the control signal may be inputted as the forward signal of a logic level '0', and the control signal may be inputted as the backward signal of a logic level '1'.

First, the input control section 122 may receive the strobe signal and output the strobe signal to the first count signal generation unit 110 in the forward route.

The first count signal generation unit 110 may generate and output the least significant bit Q0.

At this time, in the forward route, the forward feedback control section 124A may be activated and the backward feedback control section 124B may be deactivated.

The forward feedback control section 124A may output the output of the first count signal generation unit 110 to the input control section 122.

The input control section 122 may output the output of the first count signal generation unit 110 to the second count signal generation unit 111.

The second count signal generation unit 111 may generate and output the intermediate significant bit Q1.

Through the aforementioned operation, the output value of the least significant bit Q0 of the first count signal generation unit 110 may be '1', and the output value of the intermediate significant bit Q1 of the second count signal generation unit 111 may be '1'.

Then, at the time A of FIG. 4, the control signal is activated as a backward signal, so that counting is performed in the backward route. An operation in the backward route is as follows.

In the backward route, the backward feedback control section 124B may be activated and the forward feedback control section 124A may be deactivated.

The strobe signal may be inputted to the input control section 122 and inputted to the third count signal generation unit 112.

The third count signal generation unit 112 may generate and output the most significant bit Q2. At this time, the output value of the most significant bit Q2 of the third count signal generation unit 112 may be '1'.

Through the aforementioned operation, the output value of the counter circuit may be '111'. Furthermore, an effect based on this will be described in detail below.

The effect of the present invention will be described with reference to FIGS. 5 and 6.

Figure 5:
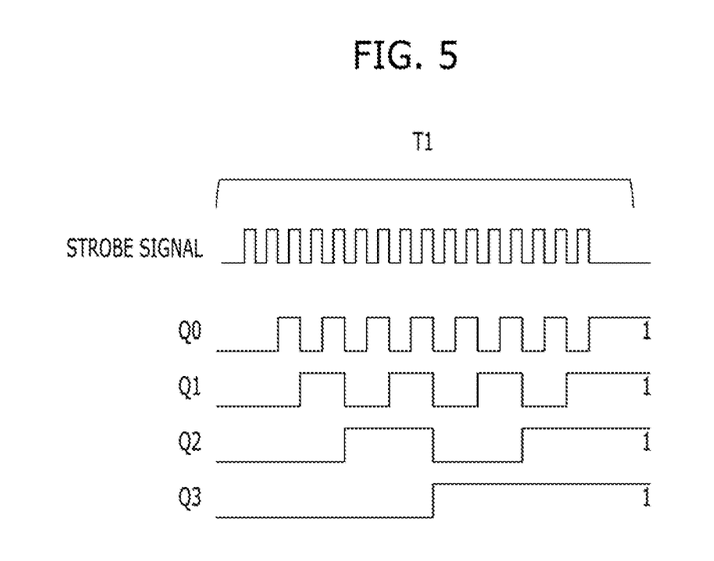
FIGS. 5 and 6 are timing diagrams explaining an effect in accordance with an exemplary embodiment of the present invention.
Figure 6:
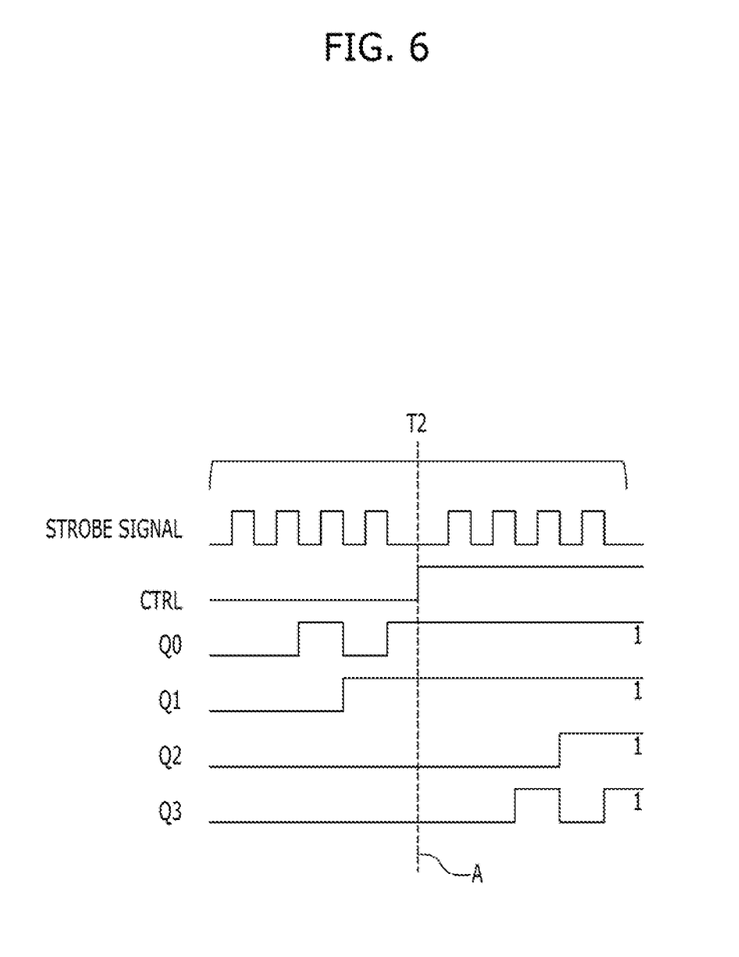

FIGS. 5 and 6 are timing diagrams explaining an effect in accordance with an exemplary embodiment of the present invention.

Referring to FIG. 5, the typical counter circuit may sequentially perform counting from the least significant bit Q0 to the most significant bit Q3 as the strobe signal is inputted for a predetermined time T1, thereby outputting '1111'. In order to complete the counter value '1111', the strobe signal is to be inputted 16 times. As the most significant bit increases by 1 bit, the strobe signal may be inputted twice to activate all bits, such as '1111'.

FIG. 6 illustrates the operation of the counter circuit in accordance with the embodiment of the present invention, and is a timing diagram in which the counter circuit receives the strobe signal for a predetermined time T2 and finally outputs a counter value '1111'.

According to the embodiment of the present invention, the counter value '1111' may be generated using only the strobe signal inputted 7 times. Referring to Table 1, the strobe signal is applied four times in the forward direction to output '0011', and a backward control signal is applied (the time A). Then, when the strobe signal is applied again, the fourth count output value '0011' is changed to the fifth count output value '1011'. This is because the counting has been performed from the most significant bit.

That is, the counting starts in the backward direction, and then the strobe signal is additionally applied three times ('1011', '0111', and '1111'), so that the counter value '1111' may obtained.

TABLE 1

| | The number of times strobe signal is applied | | | | | | |
|---|---|---|---|---|---|---|---|
| | 1 | 2 | 3 | 4 | 5 | 6 | 7 |
| Counter circuit output value | 0000 | 0001 | 0010 | 0011 | 1011 | 0111 | 1111 |

As described above, the counter circuit according to the embodiment of the present invention includes the lower bit generation unit that generates the lower bit and the upper bit generation unit that generates the upper bit, and includes the control unit, thereby controlling the forward route and the backward route in response to the control signal CTRL. The counter circuit may change the counting directions of the upper bit and the lower bit based on the forward route and the backward route. In detail, the upper bit is generated in response to the lower bit in the forward route, and the lower bit is generated in response to the upper bit in the backward route, so that obtain the output values of the counter circuit may obtained as illustrated in Table 1.

Furthermore, according to the embodiment of the present invention, by reducing the number of times the strobe signal is applied, the counting time, i.e., T2 of the embodiment, may be decreased. That is, the counting may be quickly performed to reduce power consumption due to the oscillating of the strobe signal for the counting. As a consequence, a target counter value may be quickly generated.

Furthermore, in the case of applying a pulse-type test signal in a semiconductor chip and decoding a counter signal outputted from an internal counter in response to the test signal, a target decoding signal may be quickly generated. Particularly, the counter circuit according to the embodiment of the present invention may also be applied to an address counter included in the form of an array in the semiconductor chip. This will be described in detail below.

Figure 7:
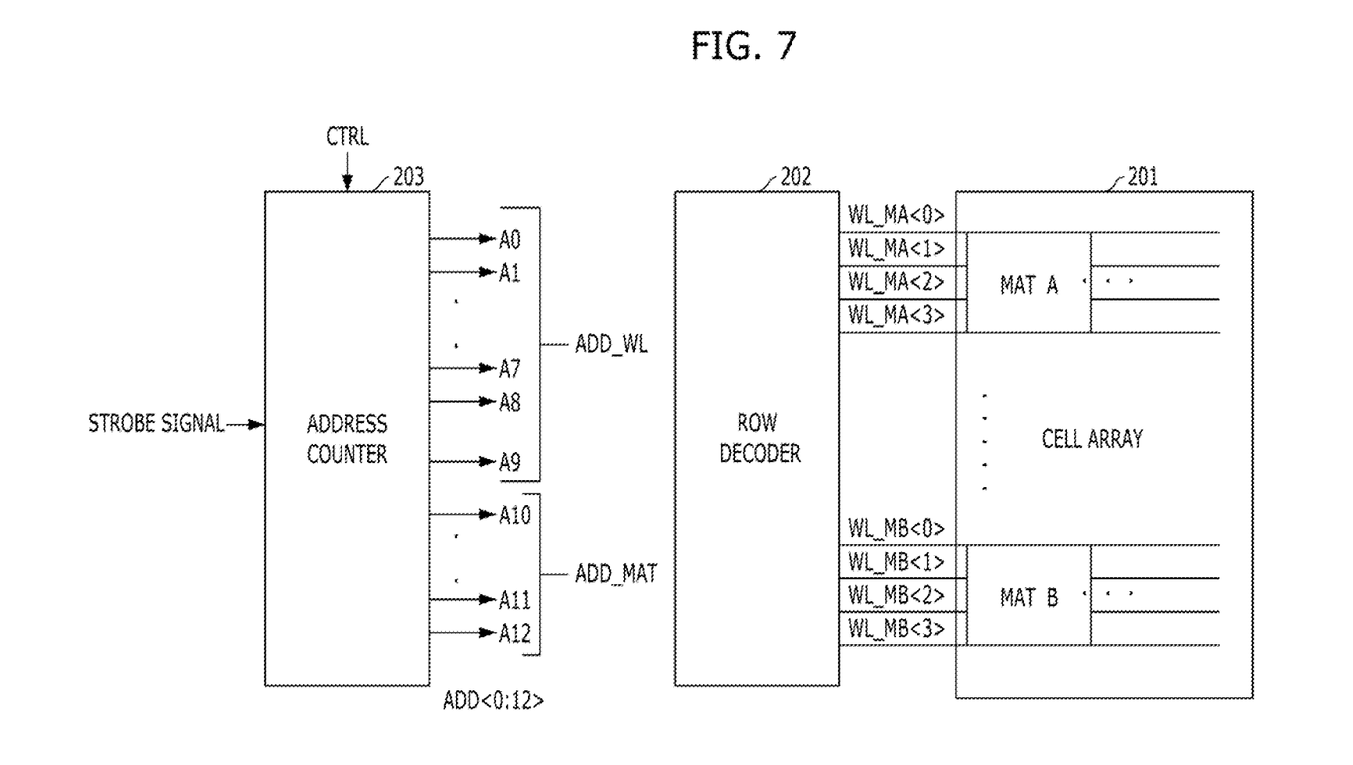
FIG. 7 is a block diagram illustrating a semiconductor device in accordance with an exemplary embodiment of the present invention

FIG. 7 is a block diagram illustrating a semiconductor device in accordance with an exemplary embodiment of the present invention.

Referring to FIG. 7, the semiconductor device may include an address counter 203, a row decoder 202, and a cell array 201.

The cell array 201 may include a plurality of groups of memory cells. In detail, the semiconductor device classifies sets of memory cells based on several units in order to easily controller the memory cells. For example, the sets of the memory cells are classified as banks and the bank is classified into mats. In the embodiment, only two mats MAT A and MAT B will be described as an example.

In the cell array, numerous word lines WL_MA<N> to WL_MB<N> are formed in a row direction for data reading and writing. In detail, when the bank is classified into the mat A MAT A and the mat B MAT B, the word lines may also be classified into the word line WL_MA<N> corresponding to the mat A MAT A and the word line WL_MB<N> corresponding to the mat B MAT B.

The address counter 203 may include a word line address signal generation unit (not illustrated), a mat address signal generation unit (not illustrated), and a control unit (not illustrated). The configuration of the address counter 203 may be substantially the same as that of the counter circuit (FIG. 1) of one embodiment of the present invention. According to another embodiment of the present invention, in order to select row addresses WL_MA<N> to WL_MB<N>, a plurality of count signal generation units corresponding to these addresses may be further included. Hereinafter, the configuration of the address counter 203 will be described with reference to FIG. 1.

The word line address signal generation unit (not illustrated) may correspond to the first count signal generation unit 110 of one embodiment of the present invention, and the mat address signal generation unit (not illustrated) may correspond to the second and third count signal generation units 111 and 112 of one embodiment of the present invention.

Furthermore, the word line address signal generation unit (not illustrated) may correspond to the first and second count signal generation units 110 and 111 of one embodiment of the present invention. At this time, the mat address signal generation unit (not illustrated) may correspond to the third count signal generation unit 112 (shown in FIG. 1) of one embodiment of the present invention.

The word line address signal generation unit (not illustrated) may generate a word line address signal ADD_WL. The mat address signal generation unit (not illustrated) may generate a mat address signal ADD_MAT.

The control unit 120 may be further included to provide a forward route and a backward route in response to the control signal CTRL, similarly to one embodiment in FIG. 1.

The input control section 122 may receive the strobe signal and output the strobe signal to one of the word line address signal generation unit (not illustrated) and the mat address signal generation unit (not illustrated).

The forward feedback control section 124A may transmit the output of the word line address signal generation unit and the mat address signal generation unit to the forward route. The backward feedback control section 124B may transmit the output of the word line address signal generation unit and the mat address signal generation unit to the backward route.

To this end, the forward feedback control section 124A and the backward feedback control section 124B may include path gates.

The row decoder 202 may generate the row addresses WL_MA<N> to WL_MB<N>, which are selection signals for the cell array 201, in response to output signals ADD<A0:A12> received from the address counter 203.

Hereinafter, an operation of another embodiment of the present invention will be described.

In order to facilitate the understanding of the embodiment, the operation of the embodiment of the present invention will be described in a refresh operation of the semiconductor device. However, the present invention is not limited thereto.

In the refresh operation, the word lines WL_MA<N> to WL_MB<N> of the cell array 201 is to be selected in a preset order. When the word lines WL_MA<N> to WL_MB<N> are selected, the refresh operation is performed for the cell array 201 coupled to the selected word lines WL_MA<N> to WL_MB<N>. In order to select the word lines WL_MA<N> to WL_MB<N>, the semiconductor device may include the address counter 203 and the row decoder 202.

When the address counter 203 generates address signals ADD<0:12> including 13 bits, nine serial bits from the least significant bit may be word line address signals ADD<0:8>, and the other four bits may be mat address signals ADD<9:12>.

The operation of the address counter 203 may be substantially the same as that of the counter circuit (FIG. 1) of one embodiment of the present invention. According to another embodiment of the present invention, in order to select the row addresses WL_MA<N> to WL_MB<N>, a plurality of count signal generation units corresponding to these addresses may be further included. Accordingly, the address counter 203 according to another embodiment of the present invention may operate as follows.

The address counter 203 may determine the direction of address counting in response to the control signal CTRL. When the control signal CTRL is a forward signal, the address counter 203 may sequentially oscillate bits from the least significant bit A0 to the most significant bit A12. That is, the address counter 203 may generate the word line address signal ADD_WL and then generate the mat address signal ADD_MAT.

Furthermore, the address counter 203 may apply the strobe signal in the backward direction in response to a backward signal. That is, the address counter 203 may sequentially oscillate bits from the most significant bit A12 to the least significant bit A0, generate the mat address signal ADD_MAT, and then generate the word line address signal ADD_WL.

The row decoder 202 may decode the mat address signal ADD_MAT and the word line address signal ADD_WL from the address counter 203, thereby generating the row addresses WL_MA<N> to WL_MB<N>. The row decoder 202 may decode the address signals ADD_MAT and ADD_WL generated by the address counter 203, and select word lines WL_MA<N> to WL_MB<N> corresponding to a decoding result among a plurality of word lines WL_MA<N> to WL_MB<N> belonging to a corresponding mat. For example, the row decoder 202 may select a word line corresponding to the mat A MAT A or the mat B MAT B.

In the cell array 201, a refresh operation of memory cells corresponding to the selected row address WL_MA<0:N> and WL_MB<0:N> may be performed.

In the conventional art, when a refresh operation mode is performed, a row address sequentially increases at a predetermined cycle and word lines WL_MA<N> to WL_MB<N> of a memory cell are selected. That is, a refresh operation is sequentially performed for each word line in one mat, and then is performed for a next mat. Thus, since address signals are sequentially oscillated from the word line address signal ADD_WL to the mat address signal ADD_MAT, it takes much time to access a specific mat.

However, according to the embodiment of the present invention, the oscillating direction is controlled, so that it may be controlled in the backward direction. For example, the mat address signal ADD_MAT may oscillate first to access a target mat, and then the word line address signal ADD_WL may be generated.

Hereinafter, the operations of the address counter 203 and the row decoder 202 will be described in detail.

In the embodiment, the address signals are classified into the word line address signal ADD_WL and the mat address signal ADD_MAT, which include a plurality of bits. However, in order to facilitate the understanding of the operations, the operations will be described using an address signal including three bits with reference to Table 2.

In Table 2, it is described as an example that word lines corresponding to the mat A MAT A are WL_MA<0:3>, word lines corresponding to the mat B MAT B are WL_MB<0:3>, and addresses for selecting these word lines are Q<2:0>.

As illustrated in Table 2, the addresses Q<2:0> sequentially increase in the order of 000, 100, 010, ..., 111 (Q0, Q1, and Q2), and the word lines WL_MA<0>, WL_MA<1>, WL_MA<2>, ..., WL_MB<3> are selected.

TABLE 2

| Q2 | Q1 | Q0 | address and row address |
|---|---|---|---|
| 0 | 0 | 0 | WL_MA<0> |
| 0 | 0 | 1 | WL_MA<1> |
| 0 | 1 | 0 | WL_MA<2> |
| 0 | 1 | 1 | WL_MA<3> |
| 1 | 0 | 0 | WL_MB<0> |
| 1 | 0 | 1 | WL_MB<1> |
| 1 | 1 | 0 | WL_MB<2> |
| 1 | 1 | 1 | WL_MB<3> |

That is, Q<0:1> may be the word line address signals and Q<2> may be the mat address signal. Counting is sequentially performed from the least significant bit Q0 to access the word lines WL_MA<0:3> corresponding to the mat A MAT A, and then the word lines WL_MB<0:3> corresponding to the mat B MAT B. However, according to the embodiment of the present invention, the counting is performed from the most significant bit Q2 and the address Q<2> is generated, so that the word lines WL_MB<0:3> of the mat B Mat B may be preferentially selected.

The mat address signal ADD_MAT and the word line address signal ADD_WL according to the embodiment may operate in this way. When the control signal CTRL is a backward signal, the address counter 203 receives the strobe signal in the backward route, performs counting from the most significant bit A12, and generates the mat address signal ADD_MAT. Furthermore, when the control signal CTRL is a forward signal, the address counter 203 may receive the strobe signal in a forward route, perform counting from the least significant bit A0, and generate the word line address signal ADD_WL. In this way, it may shorten a time for accessing a specific mat.

In the refresh operation, the operation according to the embodiment may be performed as follows.

When the address counter 203 applies the strobe signal in the backward direction in response to the control signal CTRL, counting is performed from the mat address signal ADD_MAT. At this time, a refresh operation is sequentially performed for one word line address in each mat. Then, the refresh operation is performed for another word line of each mat in response to a next word line address signal ADD_WL. After a target mat is accessed, a word line address signal ADD_WL may be generated in the forward direction, and the refresh operation may be performed for word line addresses of a corresponding mat.

Before the present invention is applied, since mats of the cell array 201 are sequentially accessed, it may take much time to access a specific mat. However, according to the embodiment of the present invention, it may quickly access a target mat, and then perform a refresh operation for word lines of a corresponding mat.

While the present invention has been described with respect to the specific embodiments, it will be apparent to those skilled in the art that various changes and modifications may be made without departing from the spirit and scope of the invention as defined in the following claims.

What is claimed is:

1. A counter circuit comprising:
   a lower count signal generation unit suitable for generating a lower bit;
   an upper count signal generation unit suitable for generating an upper bit; and
   a control unit suitable for determining a counting route in response to a control signal and controlling the lower and upper count signal generation units based on a determined route,
   wherein in a first route, the upper bit is generated in response to the lower bit, and in a second route, the lower bit is generated in response to the upper bit,
   wherein the control unit transfers a strobe signal to one of the lower count signal generation unit and the upper count signal generation unit in response to the control signal.

2. The counter circuit of claim 1, wherein the lower count signal generation unit and the upper count signal generation unit each comprise a plurality of flip-flops that are serially coupled to one another.

3. The counter circuit of claim 1, wherein the control unit comprises:
   an input control section suitable for inputting flail the strobe signal to one of the lower count signal generation unit and the upper count signal generation unit in response to the control signal;
   a forward feedback control section suitable for transmitting the lower bit to the input control section in response to the control signal; and
   a backward feedback control section suitable for transmitting the upper bit to the input control section in response to the control signal.

4. The counter circuit of claim 3, wherein the input control section comprises:
   a multiplexer suitable for inputting the strobe signal to the lower count signal generation unit in the first route and the upper count signal generation unit in the second route, in response to the control signal.

5. The counter circuit of claim 4, wherein the multiplexer inputs an output of the forward feedback control section to the upper count signal generation unit in the first route and an output of backward feedback control section to the lower count signal generation unit in the second route, in response to the control signal.

6. The counter circuit of claim 3, wherein the forward feedback control section and the backward feedback control section include a path gate.

7. A counter circuit comprising:
   a plurality of count signal generation units suitable for generating a plurality of bits of an output signal by counting a strobe signal; and
   a control unit suitable for inputting the strobe signal to a first count signal generation unit generating a least significant bit of the output signal or a last count signal generation unit generating a most significant bit of the output signal in response to a control signal,
   wherein the control unit transmits the strobe signal through the count signal generation units in a first order of the first to last count signal generation units when the strobe signal is inputted to the first count signal generation unit, and
   the control unit transmits the strobe signal through the count signal generation units in a second order of the last to first count signal generation units when the strobe signal is inputted to the last count signal generation unit.

8. The counter circuit of claim 7, wherein the count signal generation units each comprises a plurality of flip-flops that are serially coupled to one another.

9. The counter circuit of claim 7, wherein the control unit comprises:
   an input control section suitable for inputting the strobe signal to one of the first count signal generation unit and the last count signal generation unit in response to the control signal;
   a forward feedback control section for the first order; and
   a backward feedback control section for the second order.

10. The counter circuit of claim 9, wherein the forward feedback control section and the backward feedback control section include a path gate.

11. A semiconductor device comprising:
    a cell array including a plurality of groups of memory cells, each group of memory cells connected to a majority of word lines;
    an address counter suitable for generating a word line address signal for selecting the word lines and a mat address signal for selecting the groups of memory cells in response to a strobe signal; and
    a row decoder suitable for activating the word lines in response to the word line and mat address signals,
    wherein the address counter performs an counting operation in a first order from the word line address signal to the mat address signal in response to a first logic level of a control signal, and performs the counting operation in a second order from the mat address signal to the word line address signal in response to a second logic level of the control signal.

12. The semiconductor device of claim 11, wherein the address counter comprises:

a word line address signal generation unit suitable for generating the word line address signal;

a mat address signal generation unit suitable for generating the mat address signal; and a control unit suitable for determining the order of the counting operation in response to the logic level of the control signal.

13. The semiconductor device of claim 11, wherein the word line address signal generation unit and the mat address signal generation unit each comprises a plurality of flip-flops that are serially coupled to one another.

14. The semiconductor device of claim 11, wherein the control unit comprises:

an input control section suitable for inputting the strobe signal to one of the word line address signal generation unit and the mat address signal generation unit in response to the control signal;

a forward feedback control section for the first order; and a backward feedback control section for the second order.

15. The semiconductor device of claim 14, wherein the forward feedback control section and the backward feedback control section include a path gate.

16. A counter circuit comprising:

a first count signal generation unit suitable for generating a least significant bit;

a second count signal generation unit suitable for generating an intermediate significant bit;

a third count signal generation unit suitable for generating a most significant bit; and a control unit suitable for providing a forward route and a backward route in response to a control signal, wherein in the forward route, a strobe input signal is provided to the first count signal generation unit, output of the first count signal generation unit is provided as input of the second count signal generation unit, and output of the second count signal generation unit is provided as input of the third count signal generation unit, and in the backward route, the strobe input signal is provided to the third count signal generation unit, output of the third count signal generation unit is provided as input of the second count signal generation unit, and output of the second count signal generation unit is provided as input of the first count signal generation unit.

17. The counter circuit of claim 16, wherein the first count signal generation unit, the second count signal generation unit, and the third count signal generation unit are a plurality of flip-flops that are serially coupled to one another.

18. The counter circuit of claim 16, wherein the control unit comprises:

an input control section that receives a strobe signal and outputs the strobe signal to one of the first count signal generation unit and the third count signal generation unit;

a forward feedback control section for the forward route; and a backward feedback control section for the backward route.

19. The counter circuit of claim 18, wherein the input control section comprises:

a multiplexer that outputs the strobe signal to the first count signal generation unit in the forward route and outputs the strobe signal to the third count signal generation unit in the backward route in response to the control signal.

20. The counter circuit of claim 18, wherein the forward feedback control section and the backward feedback control section include a path gate, respectively.

* * * * *